United States Patent
Chang et al.

(10) Patent No.: US 11,735,379 B2
(45) Date of Patent: Aug. 22, 2023

(54) KEYSWITCH ASSEMBLY

(71) Applicant: Darfon Electronics Corp., Taoyuan (TW)

(72) Inventors: Li-Te Chang, Taoyuan (TW); Chih-Hung Chen, Taoyuan (TW); Yen-Ting Chen, Taoyuan (TW)

(73) Assignee: DARFON ELECTRONICS CORP., Taoyuan (TW)

( * ) Notice: Subject to any disclaimer, the term of this patent is extended or adjusted under 35 U.S.C. 154(b) by 0 days.

(21) Appl. No.: 17/715,143

(22) Filed: Apr. 7, 2022

(65) Prior Publication Data

US 2022/0328266 A1 Oct. 13, 2022

Related U.S. Application Data

(60) Provisional application No. 63/255,450, filed on Oct. 14, 2021, provisional application No. 63/233,348, (Continued)

(30) Foreign Application Priority Data

Feb. 17, 2022 (TW) .................................. 111105873

(51) Int. Cl.
*H01H 13/14* (2006.01)
*H01H 13/20* (2006.01)

(52) U.S. Cl.
CPC ............ *H01H 13/14* (2013.01); *H01H 13/20* (2013.01)

(58) Field of Classification Search
CPC ........ H01H 13/14; H01H 13/20; H01H 3/122; H01H 2219/056; H01H 3/12; H01H 3/125;
(Continued)

(56) References Cited

U.S. PATENT DOCUMENTS

| 4,479,111 A | 10/1984 | Madsen et al. |
| 4,836,636 A | 6/1989 | Obara et al. |

(Continued)

FOREIGN PATENT DOCUMENTS

| CN | 101834081 B | 9/2012 |
| CN | 203521244 U | 4/2014 |

(Continued)

OTHER PUBLICATIONS

Non-Final Office Action dated Feb. 16, 2023, issued U.S. Appl. No. 17/715,120.

*Primary Examiner* — Lheiren Mae A Caroc
(74) *Attorney, Agent, or Firm* — McClure, Qualey & Rodack, LLP

(57) ABSTRACT

A keyswitch assembly includes a switch module, a support mechanism, a blocking mechanism, an enhancing light source, and a backlight source. The switch module includes a substrate, a signal generator, and a signal sensor. The signal generator generates a sensing signal. The signal sensor receives the sensing signal to obtain a sensing strength. The support mechanism is disposed on the substrate. The blocking mechanism is disposed on the substrate and has a light-permeable portion. A portion of the blocking mechanism inserts into or escapes from a gap between the signal generator and the signal sensor. The backlight source is disposed on the substrate and located outside the vertical projection of the blocking mechanism on the substrate. The enhancing light source is disposed on the substrate and located within the vertical projection of the blocking mechanism on the substrate and corresponds to the light-permeable portion.

20 Claims, 7 Drawing Sheets

Related U.S. Application Data filed on Aug. 16, 2021, provisional application No. 63/171,633, filed on Apr. 7, 2021.

(58) Field of Classification Search
CPC ........... H01H 13/70; H03K 2217/9651; H03K 2217/9653; H03K 17/968; H03K 17/969; H03K 17/97; H03K 17/972
See application file for complete search history.

(56) References Cited

U.S. PATENT DOCUMENTS

| | | | |
|---|---|---|---|
| 5,266,949 | A | 11/1993 | Rossi |
| 5,813,521 | A | 9/1998 | Koike et al. |
| 6,867,680 | B1 | 3/2005 | Kulle |
| 7,138,587 | B2 | 11/2006 | Nishino et al. |
| 8,299,382 | B2 | 10/2012 | Takemae et al. |
| 9,099,261 | B2 | 8/2015 | Hsu et al. |
| 9,236,205 | B2 | 1/2016 | Hsu et al. |
| 9,634,661 | B1 | 4/2017 | Chen |
| 9,838,006 | B2 | 12/2017 | Chen |
| 9,952,682 | B2 | 4/2018 | Zhang et al. |
| 10,637,470 | B2 | 4/2020 | Wang et al. |
| 11,018,667 | B2 | 5/2021 | Yang et al. |
| 11,108,393 | B2 | 8/2021 | Yang et al. |
| 11,223,357 | B2 * | 1/2022 | Hsieh .................. H03K 17/968 |
| 11,257,635 | B2 | 2/2022 | Ruff |
| 2016/0179212 | A1 | 6/2016 | Toraille et al. |
| 2017/0019102 | A1 | 1/2017 | Chen |
| 2017/0090104 | A1 | 3/2017 | Cao et al. |
| 2017/0115747 | A1 | 4/2017 | Chen et al. |
| 2017/0178830 | A1 | 6/2017 | Feng |
| 2017/0264294 | A1 | 9/2017 | Li |
| 2018/0008619 | A1 | 1/2018 | Baheti et al. |
| 2020/0294733 | A1 | 9/2020 | Ruff |
| 2020/0411257 | A1 | 12/2020 | Chang et al. |
| 2021/0351773 | A1 | 11/2021 | Yang et al. |
| 2022/0044886 | A1 * | 2/2022 | Han ....................... H01H 3/125 |
| 2022/0328265 | A1 * | 10/2022 | Chang ................ H01H 13/7065 |
| 2022/0385288 | A1 | 12/2022 | Yang et al. |

FOREIGN PATENT DOCUMENTS

| | | |
|---|---|---|
| CN | 203812764 U | 9/2014 |
| CN | 204130394 U | 1/2015 |
| CN | 204407228 U | 6/2015 |
| CN | 204441139 U | 7/2015 |
| CN | 204442328 U | 7/2015 |
| CN | 104991319 A | 10/2015 |
| CN | 104992867 A | 10/2015 |
| CN | 105006396 A | 10/2015 |
| CN | 105097342 A | 11/2015 |
| CN | 205004229 U | 1/2016 |
| CN | 205004233 U | 1/2016 |
| CN | 105429620 A | 3/2016 |
| CN | 205092842 U | 3/2016 |
| CN | 104299818 B | 9/2016 |
| CN | 105931907 A | 9/2016 |
| CN | 104362019 B | 1/2017 |
| CN | 206180999 U | 5/2017 |
| CN | 107017870 A | 8/2017 |
| CN | 105118723 B | 11/2017 |
| CN | 206758332 U | 12/2017 |
| CN | 208226984 U | 12/2018 |
| CN | 106887358 B | 3/2020 |
| CN | 111180233 A | 5/2020 |
| CN | 111725015 A | 9/2020 |
| CN | 112133583 A | 12/2020 |
| CN | 110199369 B | 7/2021 |
| TW | 201705171 A | 2/2017 |
| TW | 201735079 A | 10/2017 |
| TW | 201931405 A | 8/2019 |
| TW | 201931408 A | 8/2019 |
| TW | M603617 U | 11/2020 |
| TW | 202103197 A | 1/2021 |

* cited by examiner

KEYSWITCH ASSEMBLY

BACKGROUND OF THE INVENTION

1. Field of the Invention

The invention generally relates to a keyswitch. Particularly, the invention relates to a keyswitch assembly with a sensing switch and duo light sources.

2. Description of the Prior Art

Membrane keyswitches and mechanical keyswitches are common types of keyswitch for keyboards. The major difference between the membrane keyswitch and the mechanical keyswitch is the circuit structure for generating the triggering signal. In general, the membrane keyswitch utilizes the membrane circuit as a switch for generating the triggering signal. When the keycap is pressed to trigger the membrane circuit, the upper circuit layer is deformed to enable the upper switch contact of the upper circuit layer to contact the corresponding lower switch contact of the lower circuit layer, so the membrane circuit is conducted to generate the signal. However, the membrane circuit is easily damaged and difficult to be repaired when it is frequently used or operated by improper forces. Moreover, when the user presses the keycap to trigger the membrane circuit, the tactile feedback is less significant, which causes the pressing feeling to be poor and cannot satisfy the user's expectation.

The mechanical keyswitch is triggered based on whether the metal piece and the metal contact are conducted. However, the metal piece and the metal contact are easily worn out due to operation impact, which reduces the life of the keyswitch. The metal piece and the metal contact are also prone to rusty, resulting in poor conduction, which affects the operation stability of the keyswitch. Moreover, conventional mechanical keyswitches are more complicated in structure and bigger in volume and not suitable for portable electronic devices having higher thinning requirements, such as laptop computers, and dedicated designs need to be therefore developed. However, for the keyswitches applicable on a thinning portable electronic device, aside from meeting the requirements of thinning design, enhancing the backlight illumination effect is also an issue that needs to be considered in parallel.

SUMMARY OF THE INVENTION

The embodiments of a keyswitch assembly according to the present invention aim at multiple design requirements: (1) providing an enhancing light source (in addition to a backlight source) to improve the overall backlight illumination effect; (2) achieving an optimized position arrangement for duo light sources and a sensing switch within the limited space of a keyswitch assembly; (3) reducing the interference to the sensing switch, either from the duo light sources or from the external environment.

In an embodiment, a keyswitch assembly comprises: a switch module comprising a substrate, a signal generator, and a signal sensor, wherein the substrate has a top surface, the signal generator and the signal sensor are disposed on the substrate, the signal generator is configured to provide a sensing signal to the signal sensor, and the signal sensor is configured to receive the sensing signal to correspondingly obtain a sensing intensity; a support mechanism disposed on the top surface, a top portion of the support mechanism moving along an up-down direction in response to a pressing force; and a blocking mechanism disposed on the top surface, a portion of the blocking mechanism driven by movement of the top portion to insert into or escape from a gap between the signal generator and the signal sensor, so as to change a magnitude of the signal strength, wherein the blocking mechanism has a light-permeable portion; a backlight source disposed on the top surface and located outside a vertical projection of the blocking mechanism on the top surface; and an enhancing light source disposed on the top surface and located within the vertical projection of the blocking mechanism on the top surface and corresponding to the light-permeable portion. In another embodiment, the keyswitch assembly further comprises a keycap disposed on the top portion of the support mechanism to be positioned over the top surface through support of the support mechanism, wherein the support mechanism supports the keycap to move up-down relative to the substrate; the backlight source and the enhancing light source are configured to emit light toward the keycap.

In another embodiment, a keyswitch assembly comprises: a switch module comprising a substrate, a signal generator, and a signal sensor, wherein the substrate has a top surface, the signal generator and the signal sensor are disposed on a first region of the top surface, the signal generator is configured to provide a sensing signal to the signal sensor, and the signal sensor is configured to receive the sensing signal to correspondingly obtain a sensing intensity; a support mechanism disposed on the top surface, a top portion of the support mechanism moving along an up-down direction in response to a pressing force; and a blocking mechanism disposed on the first region of the top surface, a portion of the blocking mechanism driven by movement of the top portion to insert into or escape from a gap between the signal generator and the signal sensor, so as to change a magnitude of the signal strength; and an enhancing light source disposed on the first region of the top surface. In another embodiment, the keyswitch assembly further comprises a blocking portion disposed between the enhancing light source and the signal generator. In another embodiment, the blocking mechanism has a light-permeable portion; the enhancing light source is located within a vertical projection of the blocking mechanism on the top surface and corresponding to the light-permeable portion. In another embodiment, the keyswitch assembly the enhancing light source is located within a vertical projection of the light-permeable portion on the top surface. In another embodiment, the keyswitch assembly further comprises a keycap disposed on the top portion of the support mechanism to be positioned over the top surface through support of the support mechanism, wherein the support mechanism supports the keycap to move up-down relative to the substrate; the enhancing light source is configured to emit light toward the keycap. In another embodiment, the keyswitch assembly further comprises a backlight source disposed on the top surface and located at a second region outside the first region, wherein the backlight source is configured to emit light toward the keycap, wherein the first region and the second region are divided by a resilient member. In another embodiment, the signal generator and the signal sensor are a combination of a light emitter and a light receiver, or the signal generator and the signal sensor are a combination of a magnet and a Hall sensor. In another embodiment, the signal generator, the signal sensor, and the enhancing light source are arranged along a signal path.

In another embodiment, a keyswitch assembly comprises: a switch module comprising a substrate, a signal generator, and a signal sensor; a support mechanism disposed on the substrate, the support mechanism having two opposite keycap ends, the two keycap ends simultaneously moving along an up-down direction in response to a pressing force; and a resilient member traversely connecting the two keycap ends, an orthographic projection of the resilient member dividing a stereoscopic space above the substrate into a first region and a second region; a backlight source and an enhancing light source respectively disposed on the substrate; and a blocking mechanism disposed over the substrate, a portion of the blocking mechanism driven by movement of the support mechanism to interfere a signal path between the signal generator and the signal sensor, wherein the enhancing light source, the signal generator, and the signal sensor are all located at the first region. In another embodiment, an enhancing light generated by the enhancing light source transmits through a light-permeable portion of the blocking mechanism to irradiate upward through the first region. In another embodiment, the backlight source is located at the second region. In another embodiment, the keyswitch assembly further comprises a shielding member covering the signal generator and the signal sensor. In another embodiment, the shielding member has a window for the portion of the blocking mechanism to interfere the signal path. In another embodiment, the shielding member comprises a blocking portion disposed between the enhancing light source and the signal generator. In another embodiment, the shielding member comprises a pre-shielding wall disposed between the signal generator and the signal sensor to partially block the signal path. In another embodiment, the blocking mechanism comprises a blocking piece, and the blocking piece at least partially overlaps with the pre-shielding wall when the blocking piece inserts between the signal generator and the signal sensor. In another embodiment, the shorter the pre-shielding wall is, the larger a change of signal sensing intensity the signal sensor receives. In another embodiment, the higher the pre-shielding wall is, the smaller a change of signal sensing intensity the signal sensor receives.

Comparing to a conventional keyswitch, the keyswitch assembly according to the embodiments of the present invention perfectly arranges the position configurations for duo light sources and a sensing switch within the limited space of a keyswitch assembly. The interference to the sensing switch is effectively reduced, either from the duo light sources or from the external environment. Therefore, the illumination effect of the keyswitch assembly may be improved by duo light sources without being complimized with unnecessary collateral drawbacks.

DETAILED DESCRIPTION OF THE PREFERRED EMBODIMENT

Figure 1:
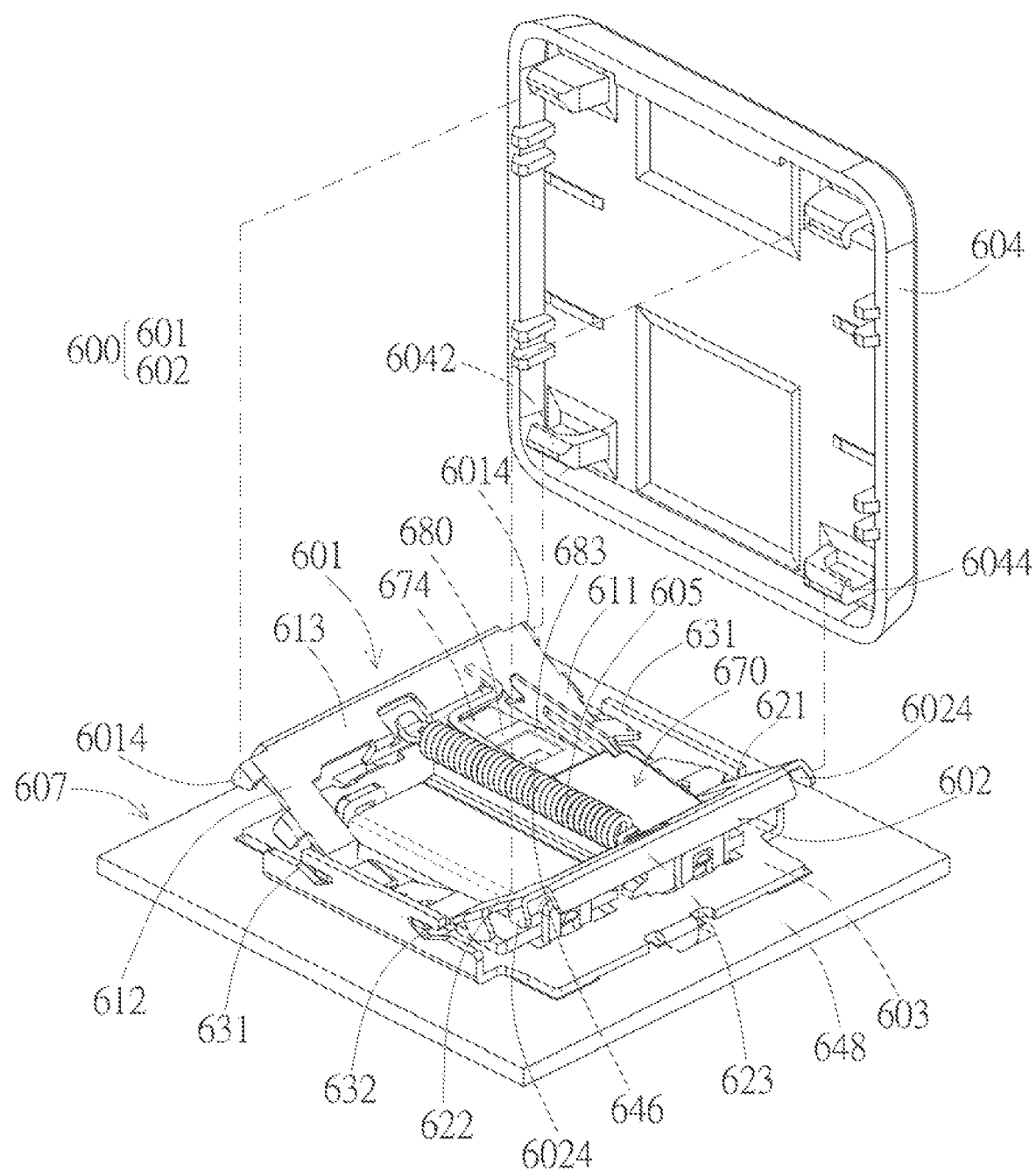
FIG. 1 is a partially exploded view of the keyswitch assembly in an embodiment of the invention.

Referring to FIG. 1, a keyswitch assembly according to an embodiment of the present invention is applicable to various pressing type input devices (such as keyboard), or integrated into any suitable electronic devices (for example a keyswitch set on a portable electronic device or a keyboard module of a notebook computer), to provide fast and accurate triggering functions. The keyswitch assembly is adapted for all sorts of keyswitch architecture designs to be installed therein and enhance its backlight illumination effects. Please refer to the drawings while reading the detailed descriptions in following paragraphs for the structures and operations of a variety of keyswitch assemblies from different embodiments according the present invention.

Figure 2A:
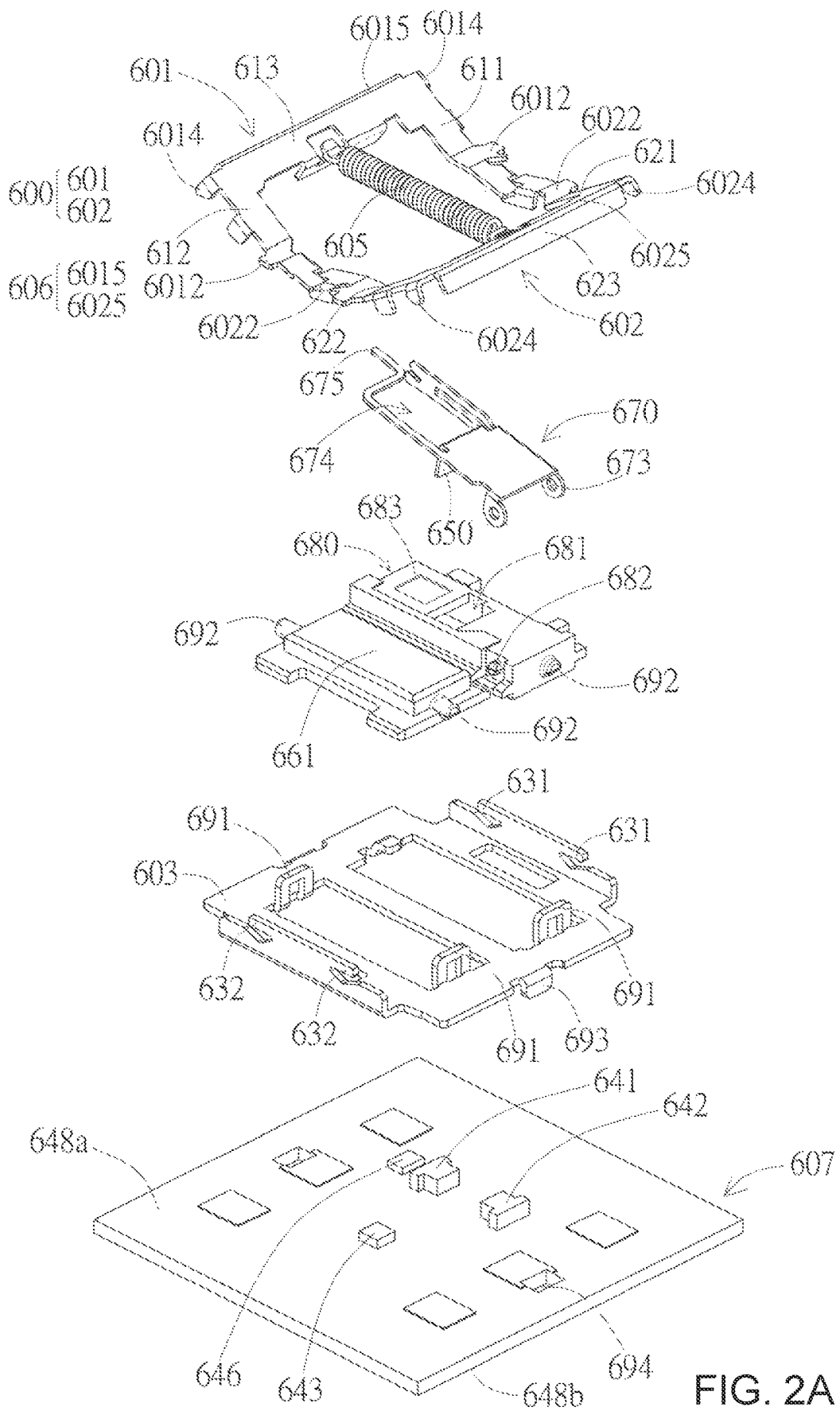
FIGS. 2A and 2B is a partially exploded view of certain components in an embodiment of the invention.
Figure 2B:
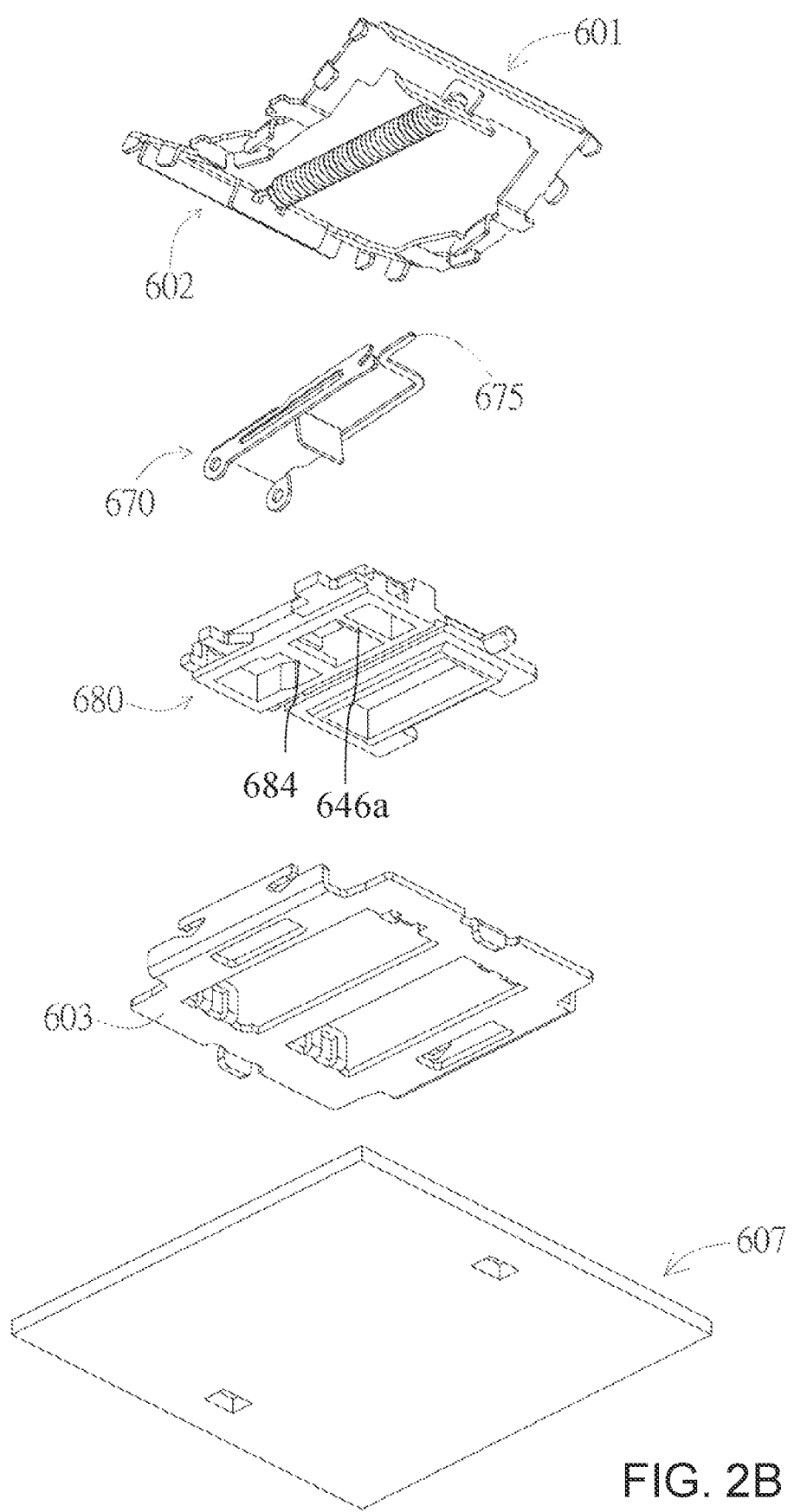

In FIGS. 1, 2A and 2B, a keyswitch assembly of the shown embodiment comprises a switch module 607, a keycap 604, a support mechanism 600, a blocking mechanism 670, a backlight source 643, and an the enhancing light source 646.

In the embodiment shown in FIGS. 1 and 2A, the switch module 607 includes a substrate 648, and a pair of a signal generator and a signal sensor. The signal generator is adapted to generate sensing signals, while the signal sensor is adapted to receive the sensing signals for obtaining corresponding sensing intensities, which are used to generate triggering events for triggering the switch module 607 to output key signals corresponding to the keyswitch assembly, thereby facilitating inputs of alphanumeric, symbol, function or operation commands into a computer system or any other information computing apparatus. In the examples provided by the following descriptions, the signal generator is realized by a light emitter 641, while the signal sensor is realized by a light receiver 642, and the sensing signal is an optical signal, so as to constitute an optical switch. However, the present invention does not exclude a solution utilizing a magnetic switch. In the following descriptions, the configured relative positions of the signal generator (light emitter 641) and the signal sensor (light receiver 642) may be exchanged there between. The present invention does not limit to the light path thereof to extend along a straight line; the function of the optical switch can still be practical by a refracted or reflected, tortuous light path. Namely, as long as the signal transmission path of an optical signal or a magnetic signal may be interfered to trigger the optical switch or the magnetic switch, the relative positions between the signal generator and the signal sensor do not require any limitation.

As the embodiment shown in FIG. 2A, the substrate 648 includes a top surface 648a and a bottom surface 648b; the light emitter 641 and light receiver 642 are respectively disposed on the top surface 648a of the substrate 648, and the light emitter 641 and light receiver 642 are configured to keep a certain gap there between. The light emitter 641 and light receiver 642 are connected with a processing circuit (not shown in the drawing) through the substrate 648, so as to operate as a switch for the triggering events. In the shown embodiment, the substrate 648 is a circuit board imbedded with a keyswitch circuit, and the light emitter 641 and light receiver 642 electrically connect with the keyswitch circuit on this circuit board to further connect to the processing circuit. In an embodiment, the substrate 648 comprises a sheet without signal transmitting function stacking with a flexible circuit board; the light emitter 641 and light receiver 642 electrically connect with the flexible circuit board disposed on the top surface 648a, so as to dispose the light emitter 641 and light receiver 642 onto they the top surface 648a of the substrate 648. The aforesaid the substrate 648 or the keyswitch circuit on the flexible circuit board of the keyswitch assembly, may further connect with other keyswitch circuits of several neighboring keyswitch assembles to jointly form a complete keyboard.

Figure 3:
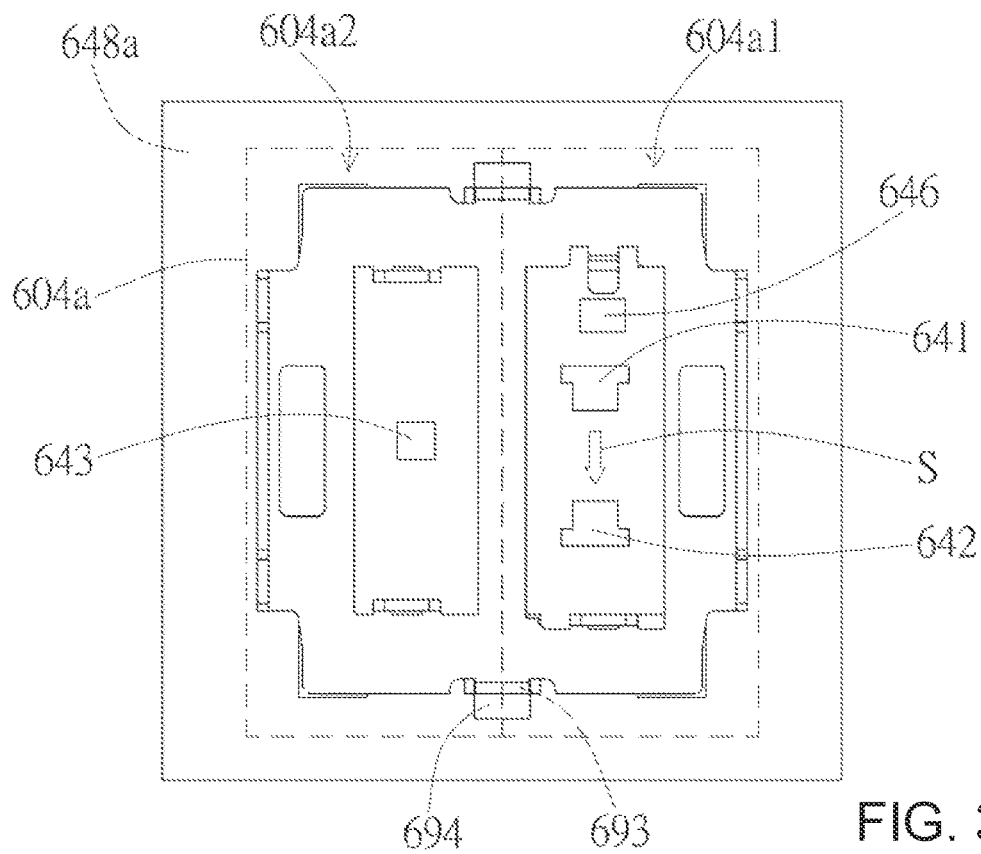
FIG. 3 is a top view of a switch module, a backlight source and an enhancing light source in an embodiment of the invention.

As the embodiment shown in FIG. 3, the sensing signal is for example certain wavelength light, especially infrared light. The light emitter 641 emits certain wavelength light towards the light receiver 642 as a sensing signal. In addition, the light receiver 642 receives such certain wavelength light, thereby generating a corresponding the sensing intensity. Generally, the light receiver 642 receives light to generate corresponding voltage signals; the sensing intensity may therefore be deemed as the voltage value of the voltage signal generated by the light receiver 642 in response to receiving the certain wavelength light.

In different embodiments, the signal generator and the signal sensor may also be realized by a magnet and a Hall sensor. The magnet is utilized to generate a magnetic field as a source for the sensing signal, while the Hall sensor utilizes the Hall Effect to sense the existence and intensity of the magnetic field to obtain the sensing intensity. Since an output voltage of the Hall sensor is proportional to the intensity of the magnetic field, the sensing intensity may therefore be deemed as the voltage value of the voltage signal generated by the Hall sensor in response to sensing the magnetic field.

Figure 4:
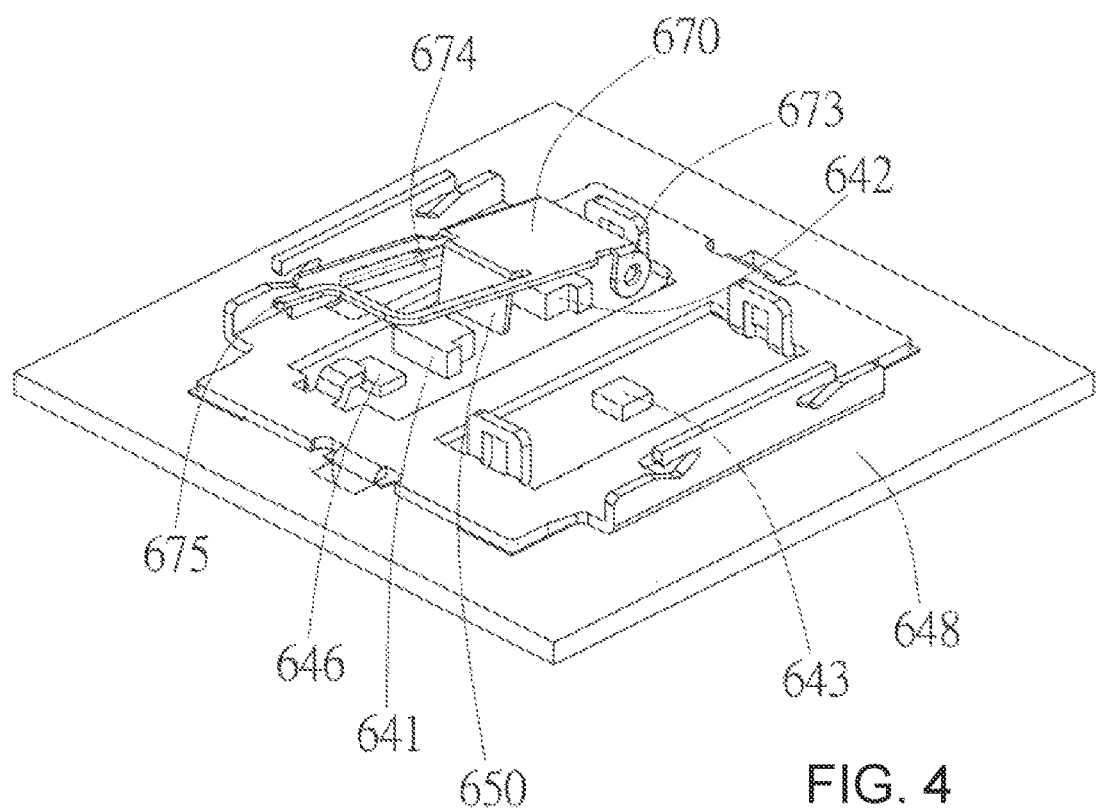
FIG. 4 is a three-dimensional view of a switch module, a blocking mechanism, a backlight source and an enhancing light source in another embodiment of the invention.

As the embodiment shown in FIG. 1 and FIG. 2A, the support mechanism 600 is disposed on the top surface 648a, and the top portion 606 of the support mechanism 600 moves up-down in response to a pressing force. Furthermore, the keycap 604 is disposed on the top portion 606 of the support mechanism 600, and a top surface of the keycap 604 receives the externally-added pressing force. The keycap 604 transfers the pressing force to the top portion 606 of the support mechanism 600, so that the top portion 606 of the support mechanism 600 moves in response to the pressing force to support the keycap 604 to move up-down relative to the substrate 648. As the embodiment shown in FIG. 4, the blocking mechanism 670 is disposed on the top surface 648a; in response to the movements of the top portion 606 of the support mechanism 600, a portion of the blocking mechanism 670 (such as blocking piece 650) inserts into or leaves from the gap between the signal generator (light emitter 641) and the signal sensor (light receiver 642) to change the data of the sensing intensity. Blocking mechanism 670 comprises a light-permeable portion 674. In a shown embodiment, the light-permeable portion 674 is hollowed; while in different exemplary embodiments, the light-permeable portion 674 may be a physical part with light-permeable characteristics. For example, the blocking mechanism 670 may be realized by a light-permeable material, and then be coated with opaque ink to define the uncoated light-permeable portion 674, or the blocking piece 650 may be coated with opaque ink to achieve the effects of blocking light. To be to be specific, in the embodiment with the signal generator and the signal sensor realized by the light emitter 641 and light receiver 642, the blocking mechanism 670 may be made by opaque materials, especially those capable of blocking light under certain wavelength. Alternatively, surfaces of the blocking mechanism 670 may be coated with opaque material, so that the blocking mechanism 670 becomes almost opaque except the light-permeable portion 674.

As the embodiment shown in FIG. 1, the keycap 604 may include one or more the outlet areas (not shown in the drawing) defined thereon. Each the outlet area may be defined as at least one text or symbol of various languages. The outlet area may be a hollowed area; light-permeable materials may or may not be filled into the hollowed area. Alternatively, the keycap 604 could be made of light-permeable materials, and opaque ink may be coated on the keycap 604 and left open the outlet area without being coated. The support mechanism 600, the blocking mechanism 670, the backlight source 643, and the enhancing light source 646 are mostly located inside a keycap projection 604a (refer to FIG. 3) projected from the keycap 604 towards the substrate 648. The keycap projection 604a may be deemed as a three-dimensional space between the keycap 604 and the substrate 648. The positions of the backlight source 643 and the enhancing light source 646 correspond to one or more outlet areas on the keycap 604, namely each of the illuminating light and the enhancing light generated from the backlight source 643 and the enhancing light source 646 respectively illuminate a different corresponding outlet area. From a top view of the keyswitch assembly, the keycap 604 may sufficiently cover the switch module 607, the support mechanism, the blocking mechanism 670, the backlight source 643 and the enhancing light source 646. When the substrate 648 is realized by a circuit board, the backlight source 643 and the enhancing light source 646 may electrically connect with the substrate 648 to receive control signals and electricity. However, if the substrate 648 does not include circuits, the backlight source 643 and the enhancing light source 646 may receive control signals and electricity from the flexible circuit board or a hard wire.

In addition, as the embodiments shown in FIGS. 2A and 2C, the backlight source 643 is disposed on the top surface 648a of the switch module 607, located outside a vertical projection of the blocking mechanism 670 projected toward the top surface 648a. The enhancing light source 646 is disposed on the top surface 648a of the switch module 607 as well, located inside the vertical projection of the blocking mechanism 670 projected toward the top surface 648a, and corresponding to the light-permeable portion 674. More to be specific, the enhancing light source 646 is located inside a vertical projection of the light-permeable portion 674 projected toward the top surface 648a. Accordingly, the illuminating light emitted from the enhancing light source 646 passes through the light-permeable portion 674 and illuminates the keycap 604 (refer to FIG. 1) from underneath. In other words, the backlight source 643 and the enhancing light source 646 may both be utilized to illuminate the keycap 604 (refer to FIG. 1) with the illuminating light and the enhancing light, thereby improving the backlight illumination effects for the keyswitch assembly according to the embodiments of the present invention.

Figure 5:
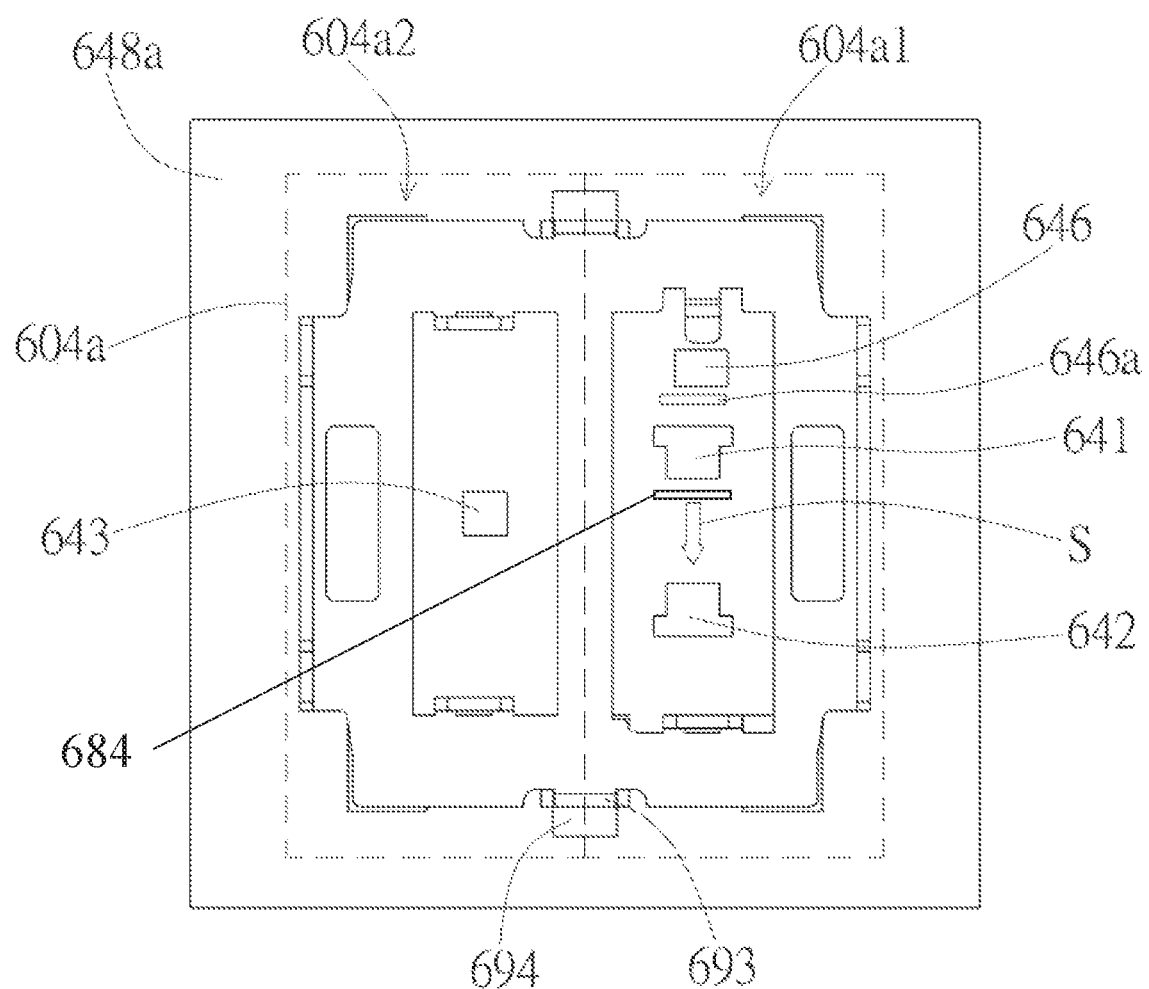
FIG. 5 is a top view of a switch module, a backlight source, an enhancing light source, an isolating portion and a pre-shielding wall in an embodiment of the invention.

As the embodiment shown in FIG. 5, to further reduce the interference to the signal sensor, the keyswitch assembly further includes an isolating portion 646a disposed between the enhancing light source 646 and the signal generator (light emitter 641), wherein the isolating portion 646a may be an isolating wall integrally or independently disposed on the top surface 648a. As the embodiment shown in FIG. 2B, a shielding member 680 includes the isolating portion 646a. The isolating portion 646a may be an isolating wall located between a window 681 and a light-permeable portion 683 of the shielding member 680. In different exemplary embodiments, the isolating portion 646a may be disposed on the top surface 648a at a side opposite the side disposing the blocking mechanism 670. It would still be workable as long as the isolating portion 646a remains inserting between the enhancing light source 646 and the signal generator at the moment the blocking piece 650 inserting between the signal generator and the signal sensor. In the shown embodiment, the signal generator (light emitter 641), the signal sensor (light receiver 642) and the enhancing light source 646 is aligned along a signal transmitting direction, and the enhancing light source 646 is disposed at a side of the signal generator opposite to the other side having the signal sensor. Accordingly, the signal generator may at least partially block the enhancing light source 646, and reduce the interference to the signal sensor from the light emitted by the enhancing light source 646. The present invention does not exclude a signal transmitting path through a refracted or reflected, tortuous light path. The signal transmitting path does not limit to the light path extending along a straight line.

As the embodiment shown in FIG. 2A, to be specific, the support mechanism includes a first support 601 and a second support 602. Each of the first support 601 and the second support 602 includes a base end 6012/6022 and a keycap end 6014/6024. The base end 6012/6022 may be moveably connected on the top surface 648a of the substrate 648. Both upper edges 6015/6025 of the first support 601 and the second support 602 jointly form the top portion 606 of the support mechanism 600. When the first support 601 and the second support 602 open outwards, the keycap ends 6014, 6024 and the keycap ends 6014, 6024 moves away from each other respectively. The keycap ends 6014, 6024 of the first support 601 and the second support 602 are moveably connected with the keycap 604, so that the keycap 604 is supported above the top portion of the support mechanism, so as to transfer the pressing force to the keycap ends 6014, 6024. On the top surface 648a of the substrate 648, the light emitter 641 and light receiver 642 are located inside a vertical projection between the keycap ends 6014, 6024 projected towards the top surface 648a.

As the embodiment shown in FIG. 1 and FIG. 2A, the resilient member 605 a tension spring or any other components that provides pulling force (such as wires made of resilient materials). The resilient member 605 horizontally connects the support mechanism. For example, the resilient member 605 connects between the keycap ends 6014, 6024, to provide a pulling force between the keycap ends 6014, 6024. The pulling force makes the keycap ends 6014, 6024 to move upwards and toward each other. Namely, the first support 601 and the second support 602 swing upwards to make the top portion of the support mechanism to move upwardly. To be specific, In the shown embodiment, the present invention does not exclude that two ends of the resilient member 605 respectively connects to other parts of the first support 601 and the second support 602; as long as the connection for the resilient member 605 facilitates the first support 601 and the second support 602 to swing upwardly, driving the keycap ends 6014, 6024 to move toward each other and move upwardly, thereby forming a restoration force by moving the top surface 648 of the support mechanism upwardly to push the keycap 604.

As FIG. 1 and FIG. 2A the embodiment shown in, to be specific, each of the first support 601 and the second support 602 includes a support body 613, 623 and two side arms 611, 612, 621, 622. For the first support 601 or the second support 602, the two side arms 611, 612, 621, 622 each extends from two ends of the support body 613, 614, and moveably connects on the top surface 648a of the substrate 648. The support body 613, 623 is perpendicular to the connecting direction of the resilient member 605. The resilient member 605 connects with the two support bodies 613, 623, to constantly provide the pulling force onto the support bodies 613, 623, so that the support bodies 613, 623 is pulled to move toward each other, forming the restoration force to push the keycap 604 to move upwardly. Each of the support body 613, 614 forms the keycap end 6014, 6024 of the first support 601 and the second support 602 respectively, while each of the side arms 611, 612, 621, 622 forms the base end 6012, 6022 of the first support 601 and the second support 602.

As FIG. 2A, FIG. 2B, FIG. 6A and FIG. 6B the embodiment shown in, the support mechanism 600 further includes a base 603 attached on the top surface 648a of the substrate 648. The base 603 includes engaging members 631, 632. The engaging member 631, 632 could be a hook type engaging member at the two ends of a standing piece, where the standing piece is integrally formed on the base 603 and protruding towards a direction away from the substrate 648. Said standing pieces may be configured in a pair disposed parallel to each other, in which each of the corresponding hooks forms one of the engaging members 631, 632. Each of the base ends 6012, 6022 may moveably connect with the engaging members 631, 632 respectively, thereby moveably connecting with the base 603. In the meanwhile, the keycap ends 6014, 6024 may moveably connect with the keycap 604, thereby forming a butterfly type support mechanism accordingly for steadily supporting the keycap 604 to move up-down relative to the substrate 648. If the engaging member 631, 632 is not disposed on a whole piece of base 603, the engaging member 631, 632 may directly fastened onto the top surface 648a of the substrate 648. Then, the base ends 6012, 6022 of the first support 601 and the second support 602 moveably connect with the engaging members 631, 632 of the top surface 648a respectively. The embodiment does not exclude to omit the base 603; instead, the embodiment can have the base end 6012, 6022 to directly and pivotally connect on the circuit board 644. Moreover, the first support 601 and the second support 602 may also pass across each other and connect at their middle portions to form a scissors type of support mechanism.

As shown in FIG. 1, specifically, the keycap 604 can be, for example, an injection-molded rectangular keycap, and the keycap 604 has coupling members 6042 and 6044 formed on its bottom surface to couple the support mechanism. In an embodiment, the coupling members 6042 and 6044 can be a coupling structure with a pivotal hole and a coupling structure with a groove, respectively. Alternatively, both the coupling members 6042 and 6044 can be coupling structures with grooves. The keycap ends 6014 and 6024 of the first frame 601 and the second frame 602 can be respectively movably connected to the coupling members 6042 and 6044, and at least one of the keycap ends 6014 and 6024 can be slidable relative to a corresponding one of the coupling members 6042 and 6044. As such, the keycap ends 6014 and 6024 can be movably connected to the keycap 604, and the keycap 604 can transfer the pressing force to the keycap ends 6014 and 6024.

As the embodiment shown in FIG. 2A, the blocking mechanism 670 includes a blocking piece 650. The blocking mechanism 670 may be rotatably and/or movably disposed on the top surface 648a of the substrate 648; wherein, the blocking mechanism 670 further includes two pivot pieces 673 to pivotally connect with the top surface 648a of the substrate 648. Substantially, the three rotating axels of the blocking mechanism 670, the first support 601 and the second support 602 are parallel to each other.

A top end 675 of the blocking mechanism 670 is movably connection with an upper section of the first support 601, at the top surface or any portion of the support body 613, so that the blocking mechanism 670 moves along with the support mechanism 600 and swing upward-downward relative to the substrate 648. The top end 675 of the blocking mechanism 670 may alternatively lean on the bottom surface of the keycap 604, so as to move along with the pressing process of the keycap 604. In other words, the blocking mechanism 670 may rotate, move or swing along with the movement of the keycap 604 (such as the bottom surface) or the support mechanism 600 (such as the first support 601). The blocking piece 650 extends downwards from the blocking mechanism 670, so as to insert into or escape from the gap between the light emitter 641 and light receiver 642 along with the rotation of the blocking mechanism 670 to change the sensing intensity. Namely, the blocking mechanism 670 interferes the light/signal transmitting path of the signal generator and the signal sensor along with the movement of the keycap 604 or the support mechanism 600, thereby triggering the switch module, generating triggering events, or generating key signals.

When the signal generator and the signal sensor are the combination of the magnet and the Hall sensor, at least the blocking piece 650 is doped with a magnetically conductive material (e.g. iron, cobalt, nickel, or alloys thereof). Alternatively, the blocking piece 650 can be made of magnetically conductive iron, cobalt, nickel or its alloy. In another embodiment, the entire blocking mechanism 670 can be made of magnetically conductive material. For example, the blocking mechanism 670 can be formed by directly stamping iron, cobalt, nickel, or their alloy sheet. However, to make the signal sensor (the Hall sensor) to detect the changes of magnetic flux does not require any portion (e.g. the blocking piece) of the blocking mechanism 670 to insert into or escape from the gap between the signal generator and the signal sensor. As long as the movement of the blocking mechanism 670 interferes the transmitting path of magnetic force (or the transmitting path of the magnetic signal) detectable changes of magnetic flux may therefore be produced.

As the embodiment shown in FIG. 1, FIG. 2A and FIG. 2B, to further reduce the interference against the signal sensor, the keyswitch assembly may further include a shielding member 680, directly or indirectly disposed of the top surface 648a of the substrate 648. The shielding member 680 includes a window 681 and a light-permeable portion 683, and the shielding member 680 surrounds the light emitter 641 and light receiver 642 to substantially covers on the signal generator (light emitter 641) and the signal sensor (light receiver 642). The window 681 allows a portion of the blocking mechanism 670 to interfere the signal transmitting path S (refer to FIG. 3). To be more specific, the blocking piece 650 of the blocking mechanism 670 may pass the window 681 and insert into the gap between the light emitter 641 and light receiver 642 to block the sensing signal. The enhancing light source 646 produces the enhancing light, disposed on the top surface 648a of the substrate 648 and corresponding to the light-permeable portion 683 of the shielding member 680. To be more specific, the enhancing light source 646 is disposed inside the vertical projection of the light-permeable portion 683 projected toward the top surface 648a. In other words, the vertical projections of the light-permeable portion 683 and the light-permeable portion 674 projected toward the top surface 648a are at least partially overlapped. Accordingly, the enhancing light generated from the enhancing light source 646 may pass through the light-permeable portion 683 and the light-permeable portion 674 to irradiate the keycap 604 (refer to FIG. 1) with the illuminated enhancing light. The pivot pieces 673 are pivotally connect with pivot pillars 682 of the shielding member 680, so that the pivot pieces 673 indirectly and pivotally connect onto the top surface 648a of the substrate 648. In different exemplary embodiments, the pivot pillars 682 may be separated from the shielding member 680 and become independent components disposed on the top surface 648a, so that the pivot pieces 673 may directly be disposed onto the top surface 648a of the substrate 648. According to different types of the signal sensors and switches, the shielding member 680 covered on the signal generator and the signal sensor may include light shielding materials or magnet shielding materials, to prevent the magnetic force or light (e.g. the illuminating light or the enhancing light) of the outer environment from interference against the signal sensor and further cause false triggering. In some embodiments, the enhancing light and the enhancing light may have different colors; the light-shielding materials of the shielding member 680 may absorb or reduce the light flux of the illuminating light (e.g. lights reflected or refracted from the keycap 604) entering the second region604a2, so as to shield and focus the irradiate scope of the enhancing light passing through the second region604a2.

As shown in FIG. 1 and FIG. 2A, the keyswitch assembly further includes a diffusion member 661. The diffusion member 661 is directly or indirectly combined with the top surface 648a of the substrate 648. The diffusion member 661 is configured to cover the backlight source 643 and located between the backlight source 643 and the keycap 604. The light emitted from the backlight source 643 can pass through the diffusion member 661 to widely irradiate the bottom surface of the keycap 604. Moreover, the sidewall used to position the diffusion member 661 can be made of light-blocking material to reduce light exiting from the horizontal direction. In the case that the signal sensor is the light receiver 642, the diffusion member 661 can prevent the interference of illumination light to the sensing intensity obtained by the light receiver.

As shown in FIG. 1 and FIG. 2A, the shielding member 680 and the diffusion member 661 can be directly combined with the baseplate 603, so as to be indirectly combined with the top surface 648a through the baseplate 603. The baseplate 603 is provided with first engaging portions 691. The shielding member 680 and the diffusion member 661 are provided with second engaging portions 692. The first engaging portion 691 and the second engaging portion 692 are matched to each other to fix the shielding member 680 and the diffusion member 661 on the baseplate 603. For example, as shown in the drawings, the second engaging portions 692 on the diffusion members 661 are protrusions, and its corresponding first engaging portions 691 are lugs, each of which protrudes upward from the baseplate 603 and has a hole. The second engaging portions 692 on the shielding member 680 may include a protrusion and a hook hole, while its corresponding first engaging portion 691 is a lug with a hole and a hook protruding upward from the baseplate 603.

Figure 6A:
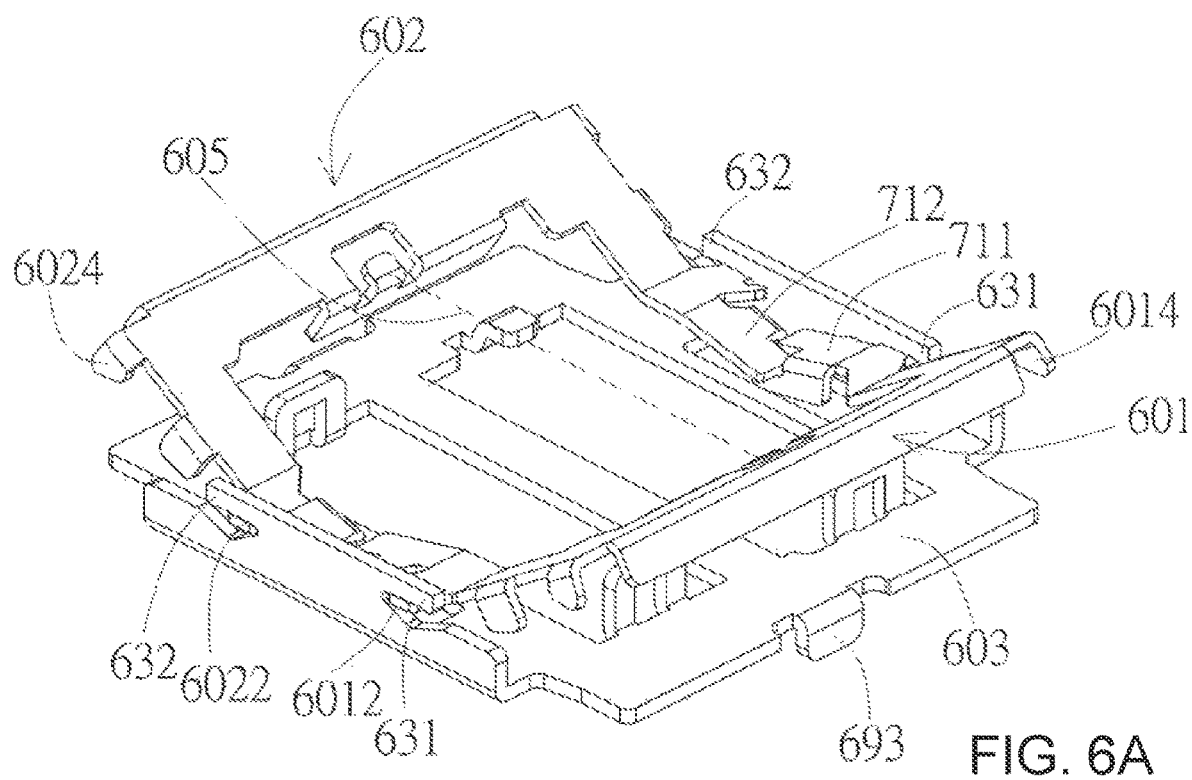
FIG. 6A is a three-dimensional view of a baseplate and two frames in another embodiment of the invention.
Figure 6B:
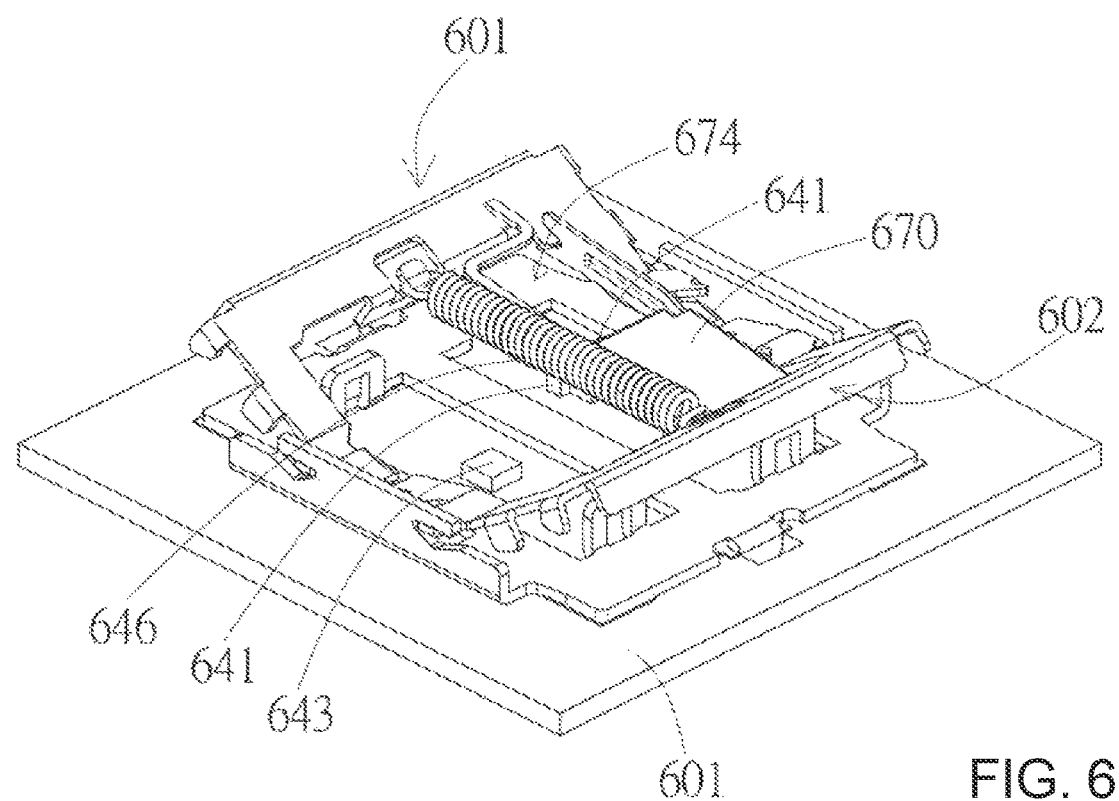
FIG. 6B is a three-dimensional view of two frames, a blocking mechanism, and a shielding member in another embodiment of the invention.

As the embodiment shown in FIG. 3 and FIG. 6A, the resilient member 605 is represented by a dashed line. The resilient member 605 traversely connects the keycap ends 6014 and 6024 of the first frame 601 and the second frame 602 along a connecting direction. When the keycap 604 is pressed to move upward and downward, the resilient member 605 also moves accordingly. Therefore a vertical projection of the resilient member 605 divides the three dimensional space between the keycap 604 and the top surface 648a of the substrate 648, namely the keycap projection 604a, into a first region604a1 and a second 604a2. The signal generator (light emitter 641), the signal sensor (light receiver 642), and the enhancing light source 646 are all disposed within the first region604a1, while the backlight source 643 is disposed in the second region604a2. In other words, this embodiment of the present invention adds the enhancing light source 646 to the first region604a1 where the signal generator (light emitter 641) and the signal sensor (light receiver 642) have occupied, and the enhancing light generated from the enhancing light source 646 must be able to pass the light-permeable portion 674 of the blocking mechanism 670, and then irradiate upwards through the first region604a1. That it, the embodiment is required to enhance the backlight illumination effects and in the meantime, the enhancing light of the enhancing light source 646 is not allowed to interfere the sensing-trigger function of the signal generator (light emitter 641) and the signal sensor (light receiver 642). In some embodiments, the illuminating light of the backlight source 643 may pass through the second region604a2 to irradiate upwards and illuminate the major symbol (an outlet area with a larger area) of the keycap 604, and meanwhile the enhancing light of the enhancing light source 646 passes through the first region604a1 to irradiate upwards and illuminate a secondary symbol or an indication area (each is an outlet area with smaller area) of the keycap 604.

As the embodiment shown in FIG. 1 and FIG. 2A, the baseplate 603 has a claw portion 693, and the substrate 648 has a corresponding hole 694. The claw portion 693 can be inserted into the hole 694 and engage with the edge of the hole 694, so as to fix the baseplate 603 on the top surface 648a of the substrate 648. Based on the detachable baseplate 603, the support mechanism, the blocking mechanism 670, the shielding member 680, and the diffusion member 661 can be pre-assembled as a sub-assembly. After the baseplate 603 is mounted on the substrate 648 through the positioning of the hole 694, the positioning of the sub-assembly can be completed, especially the positioning of the blocking piece 650 to the signal generator and the signal sensor. The keycap 604 can be pre-mounted on the sub-assembly. Alternatively, the keycap 604 can be mounted on the sub-assembly after the sub-assembly is positioned on the substrate 648. Practically, the baseplate 603 occupies a relatively small area of the substrate 648 for mounting the support mechanism, the blocking mechanism 670, the shielding member 680, and the diffusion member 661 thereon, and each keyswitch assembly can be provided a single independent baseplate 603, but not limited thereto. In another embodiment, the baseplates 603 of multiple keyswitch assemblies can be interconnected to form an integral baseplate of large area.

Figure 7:
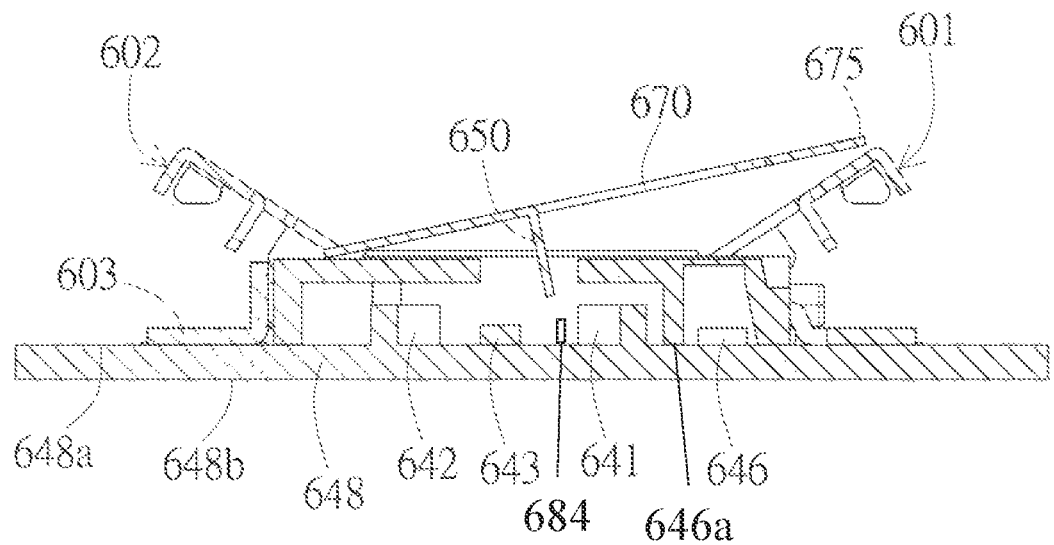
FIG. 7 and FIG. 8 are side views of the switch module, two frames, and the blocking mechanism in the first embodiment of the invention.
Figure 8:
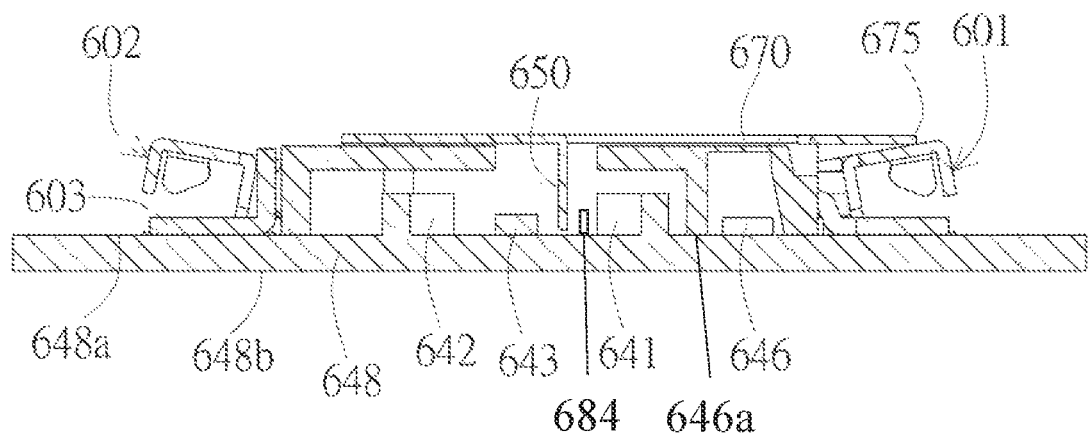

FIG. 7 and FIG. 8 are simplified to merely show the substrate 648, the light emitter 641, the light receiver 642, the first frame 601, the second frame 602, and the blocking mechanism 670. As shown in the drawings, the projection of the blocking piece 650 on the substrate 648 is substantially located between the light emitter 641 and the light receiver 642. One of the light emitter 641 and the light receiver 642 is located between the projections of the blocking piece 650 and the connecting piece 672 on the substrate 648. In the direction perpendicular the top surface 648a of the substrate 648, the blocking mechanism 670 rotates about it rotation axis, and the linear movement directions of the blocking piece 650 and the connecting piece 672 are opposite. Moreover, the front end of the blocking piece 650 is bent toward the substrate 648, so that the distance between the front end of the blocking piece 650 and the top surface 648 is reduced.

FIG. 7 illustrates a non-pressing state of the keycap 604 (refer to FIG. 1), the resilient member 605 (refer to FIG. 1) provides a pulling force so that the first support 601 and the second support 602 move toward each other and move upwardly, and drive the keycap 604 to move upwardly to a highest point in the shown embodiment. At this moment, the blocking mechanism 670 rotates to move away from the substrate 648, and drive the blocking piece 650 to move upwardly to its highest point shown in the embodiment. The blocking piece 650 may entirely or partially escape from the gap between the light emitter 641 and light receiver 642, so that the portion blocking the sensing signal may be reduced. At this moment, the obtained sensing intensity at the signal sensor, namely the light receiver 642, is a first intensity.

FIG. 8 shows a state that the keycap 604 (refer to FIG. 1) is pressed to the lowest point. The keycap 604 is pressed to move downwards and transmit the pressing force to the first support 601 and the second support 602, thereby driving the blocking mechanism 670 to rotate to face the substrate 648, and then drive the blocking piece 650 to move to the reachable lowest point shown in the embodiment to block the transmission of the sensing signal. At this moment, the obtained sensing intensity at the signal sensor or light receiver 642 a second intensity. The second intensity is generally the smallest sensing intensity in the embodiment; however, the value of the second intensity may not necessarily be zero. That is because when the keycap 604 and the blocking piece 650 is moved to the lowest point, the transmission of the sensing signal may not necessarily to be totally blocked by the blocking piece 650 to generate triggering events. The aforesaid triggering events indicates that the sensing intensity has changed from the first intensity to the second intensity, so that the backend processing circuit may determine as an input triggering to generate a corresponding input signal.

As shown in FIG. 8, what requires further explanation for the above descriptions regarding the embodiment(s) is that, the triggering events are not limited to generate only when the keycap 604, the first support 601 or the second support 602 are pressed down to the lowest point (namely the second intensity is set to the smallest value of the sensing intensity in the embodiment). In fact, considering the sensitivity requirement of the keyswitch assembly, generally a pressing input device (e.g. a keyboard) does not require to define triggering events to be generated upon the lowest point that the keycap 604 can be pressed down. A pressing input device may generally define a certain downward travel for the keycap 604 (e.g. a half of the entire downward travel) to general triggering events. Therefore, in the shown embodiments, the second intensity may be a threshold value of the lower extremity of a desired intensity; such value may be defined between the first intensity and the lowest sensing intensity. When the sensing intensity is lowered from the first intensity to the second intensity, the triggering events will then be generated. If the keycap 604 is continuously pressed to move downward, the sensing intensity will then continuously go down, only the existing triggering events will block the new triggering events to be further generated. When the keycap 604 is released and move upwardly, the sensing intensity increases to be larger than the second intensity, the processing device will determine that the former triggering event(s) have been terminated.

In different exemplary embodiments, the support mechanism 600, the backlight source 643, and the enhancing light source 646 are disposed on the top surface 648a of the substrate 648, while the signal generator (light emitter 641) and the signal sensor (light receiver 642) are disposed on the bottom surface 648b of the substrate 648. Namely, the optical switch is disposed on a surface of the substrate 648 different from the backlight source 643 and the enhancing light source 646 to form an opposite-side configuration. Accordingly, the interference from the backlight source 643 and the enhancing light source 646 to the signal sensor (light receiver 642). For the embodiment where the optical switch is replaced by a magnetic switch, such opposite-side configuration may also reduce the interference to the magnetic field and to the signal sensor from turning the backlight source 643 and the enhancing light source 646 on/off, or the movement of the metal first support 601 and second support 602. The opposite-side configuration for the optical switch or the magnetic switch requires the blocking member 650 to pass through the substrate 648 to change the sensing intensity. Yet the optical switch or the magnetic switch disposed on the bottom surface of the substrate 648 no longer requires to be disposed corresponding to the first region and the second region.

Furthermore, the gap between the signal generator (light emitter 641) and the signal sensor (light receiver 642) may have a pre-shielding wall 684 disposed there between. The pre-shielding wall 684 is a low wall disposed at the interior of the shielding member 680 or disposed directly on the top surface 648a of the substrate 648 to partially block (e.g. a half or one third thereof) the signal path. The higher the pre-shielding wall 684 is, the smaller a change of signal sensing intensity the signal sensor receives, and the triggering time may be earlier. On the other way, the shorter the pre-shielding wall 684 is, or even not disposing the pre-shielding wall 684, the larger a change of signal sensing intensity the signal sensor receives, and then the triggering timing can be later. In other words, to adjust the size, shape or materials of the pre-shielding wall 684, is applicable to adjust the triggering timing. Moreover, when the pre-shielding wall 684 and the moved blocking member 650 are partially or entirely overlapped, the blocking effect against the signal path becomes better improved.

The present invention has been properly introduced through the aforesaid embodiments. The shown embodiments are exemplary purpose only and should not be deemed as limitations to the present invention. Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A keyswitch assembly, comprising:
    a switch module comprising a substrate, a signal generator, and a signal sensor, wherein the substrate has a top surface, the signal generator and the signal sensor are disposed on the substrate, the signal generator is configured to provide a sensing signal to the signal sensor, and the signal sensor is configured to receive the sensing signal to correspondingly obtain a sensing intensity;
    a support mechanism disposed on the top surface, a top portion of the support mechanism moving along an up-down direction in response to a pressing force; and
    a blocking mechanism disposed on the top surface, a portion of the blocking mechanism driven by movement of the top portion to insert into or escape from a gap between the signal generator and the signal sensor, so as to change a magnitude of the signal strength, wherein the blocking mechanism has a light-permeable portion;
    a backlight source disposed on the top surface and located outside a vertical projection of the blocking mechanism on the top surface; and
    an enhancing light source disposed on the top surface and located within the vertical projection of the blocking mechanism on the top surface and corresponding to the light-permeable portion.

2. The keyswitch assembly of claim 1, further comprising a keycap disposed on the top portion of the support mechanism to be positioned over the top surface through support of the support mechanism, wherein the support mechanism supports the keycap to move up-down relative to the substrate; the backlight source and the enhancing light source are configured to emit light toward the keycap.

3. A keyswitch assembly, comprising:
    a switch module comprising a substrate, a signal generator, and a signal sensor, wherein the substrate has a top surface, the signal generator and the signal sensor are disposed on a first region of the top surface, the signal generator is configured to provide a sensing signal to the signal sensor, and the signal sensor is configured to receive the sensing signal to correspondingly obtain a sensing intensity;
    a support mechanism disposed on the top surface, a top portion of the support mechanism moving along an up-down direction in response to a pressing force; and
    a blocking mechanism disposed on the first region of the top surface, a portion of the blocking mechanism driven by movement of the top portion to insert into or escape from a gap between the signal generator and the signal sensor, so as to change a magnitude of the signal strength; and
    an enhancing light source disposed on the first region of the top surface.

4. The keyswitch assembly of claim 3, further comprising a blocking portion disposed between the enhancing light source and the signal generator.

5. The keyswitch assembly of claim 3, wherein the blocking mechanism has a light-permeable portion; the enhancing light source is located within a vertical projection of the blocking mechanism on the top surface and corresponding to the light-permeable portion.

6. The keyswitch assembly of claim 5, wherein the enhancing light source is located within a vertical projection of the light-permeable portion on the top surface.

7. The keyswitch assembly of claim 3, further comprising a keycap disposed on the top portion of the support mechanism to be positioned over the top surface through support of the support mechanism, wherein the support mechanism supports the keycap to move up-down relative to the substrate; the enhancing light source is configured to emit light toward the keycap.

8. The keyswitch assembly of claim 7, further comprising a backlight source disposed on the top surface and located at a second region outside the first region, wherein the backlight source is configured to emit light toward the keycap, wherein the first region and the second region are divided by a resilient member.

9. The keyswitch assembly of claim 3, wherein the signal generator and the signal sensor are a combination of a light emitter and a light receiver, or the signal generator and the signal sensor are a combination of a magnet and a Hall sensor.

10. The keyswitch assembly of claim 3, wherein the signal generator, the signal sensor, and the enhancing light source are arranged along a signal path.

11. A keyswitch assembly, comprising:
a switch module comprising a substrate, a signal generator, and a signal sensor;
a support mechanism disposed on the substrate, the support mechanism having two opposite keycap ends, the two keycap ends simultaneously moving along an up-down direction in response to a pressing force; and
a resilient member traversely connecting the two keycap ends, an orthographic projection of the resilient member dividing a stereoscopic space above the substrate into a first region and a second region;
a backlight source and an enhancing light source respectively disposed on the substrate; and
a blocking mechanism disposed over the substrate, a portion of the blocking mechanism driven by movement of the support mechanism to interfere in a signal path between the signal generator and the signal sensor,
wherein the enhancing light source, the signal generator, and the signal sensor are all located at the first region.

12. The keyswitch assembly of claim 11, wherein an enhancing light generated by the enhancing light source transmits through a light-permeable portion of the blocking mechanism to irradiate upward through the first region.

13. The keyswitch assembly of claim 11, wherein the backlight source is located at the second region.

14. The keyswitch assembly of claim 11, further comprising a shielding member covering the signal generator and the signal sensor.

15. The keyswitch assembly of claim 14, wherein the shielding member has a window for the portion of the blocking mechanism to interfere the signal path.

16. The keyswitch assembly of claim 14, wherein the shielding member comprises a blocking portion disposed between the enhancing light source and the signal generator.

17. The keyswitch assembly of claim 14, wherein the shielding member comprises a pre-shielding wall disposed between the signal generator and the signal sensor to partially block the signal path.

18. The keyswitch assembly of claim 17, wherein the blocking mechanism comprises a blocking piece, and the blocking piece at least partially overlaps with the pre-shielding wall when the blocking piece inserts between the signal generator and the signal sensor.

19. The keyswitch assembly of claim 17, wherein the shorter the pre-shielding wall is, the larger a change of signal sensing intensity the signal sensor receives.

20. The keyswitch assembly of claim 17, wherein the higher the pre-shielding wall is, the smaller a change of signal sensing intensity the signal sensor receives.

* * * * *